(12) United States Patent
Liu

(10) Patent No.: US 10,378,101 B2
(45) Date of Patent: Aug. 13, 2019

(54) APPARATUS AND METHOD FOR FILM FORMATION BY PHYSICAL SPUTTERING

(71) Applicant: WUHAN CHINA STAR OPTOELECTRONICS TECHNOLOGY CO., LTD., Wuhan, Hubei (CN)

(72) Inventor: Siyang Liu, Hubei (CN)

(73) Assignee: WUHAN CHINA STAR OPTOELECTRONICS TECHNOLOGY CO., LTD, Wuhan (CN)

( * ) Notice: Subject to any disclaimer, the term of this patent is extended or adjusted under 35 U.S.C. 154(b) by 184 days.

(21) Appl. No.: 15/539,816

(22) PCT Filed: May 25, 2017

(86) PCT No.: PCT/CN2017/085839
§ 371 (c)(1),
(2) Date: Jun. 26, 2017

(87) PCT Pub. No.: WO2018/196071
PCT Pub. Date: Nov. 1, 2018

(65) Prior Publication Data
US 2019/0003038 A1 Jan. 3, 2019

(51) Int. Cl.
*C23C 14/34* (2006.01)
*C23C 14/52* (2006.01)
(Continued)

(52) U.S. Cl.
CPC ...... *C23C 14/3492* (2013.01); *C23C 14/3407* (2013.01); *C23C 14/52* (2013.01);
(Continued)

(58) Field of Classification Search
CPC ..... C23C 14/34; C23C 14/3492; C23C 14/52; C23C 14/54; C23C 14/56; C23C 14/3407; H01J 37/34; H01J 37/3476
(Continued)

(56) References Cited

FOREIGN PATENT DOCUMENTS

CN 102443770 A1 * 5/2012
KR 10-2007-0087462 * 8/2007

OTHER PUBLICATIONS

Machine Translation of CN 102443770 A (Year: 2012).*
Machine Translation of KR 10-2007-0087462 (Year: 2007).*

* cited by examiner

*Primary Examiner* — Rodney G McDonald

(57) ABSTRACT

Disclosed is an apparatus for film formation by physical sputtering, which includes a vacuum chamber; a substrate platform arranged inside of the chamber, and provided thereon with a substrate to be formed with a film; a target material arranged inside of the chamber, and arranged opposite to the substrate; at least one square resistance meter, which is connected to the target material to real-timely measure an actual resistance value of the target material; an excitation source, which is used to bombard the target material for sputtering atoms of the target material; and a control system, which is connected to the square resistance meter. The apparatus for film formation by physical sputtering has a simple structure, can monitor the consumption of the target material in real time, effectively avoid damage of a backboard and abnormality of a product resulting from breakdown of the target material, and improve the quality of the product. Meantime, the use efficiency of the target material can be improved and thus the waste of the material, which would otherwise be caused by incomplete use of the target material, can be avoided.

8 Claims, 3 Drawing Sheets

(51) Int. Cl.
    *C23C 14/56*          (2006.01)
    *C23C 14/54*          (2006.01)
    *H01J 37/34*          (2006.01)

(52) U.S. Cl.
    CPC ............. *C23C 14/54* (2013.01); *C23C 14/56* (2013.01); *H01J 37/34* (2013.01); *H01J 37/3476* (2013.01)

(58) Field of Classification Search
    USPC ....................................... 204/298.03, 192.13
    See application file for complete search history.

APPARATUS AND METHOD FOR FILM FORMATION BY PHYSICAL SPUTTERING

CROSS-REFERENCE TO RELATED APPLICATIONS

This application claims the priority of Chinese patent application CN 201710298657.4, entitled "Apparatus and method for film formation by physical sputtering" and filed on Apr. 27, 2017, the entirety of which is incorporated herein by reference.

FIELD OF THE INVENTION

The present disclosure relates to the technical field of film formation on a substrate, and in particular, to an apparatus and a method for film formation by physical sputtering.

BACKGROUND OF THE INVENTION

In a procedure of manufacturing a thin film transistor (TFT) substrate, it is required to deposit Al, Mo, Ti, Cu and other metal films, and ITO, IGZO and other non metal films on a glass substrate. The manufacturing procedure is usually achieved by using a physical vapor deposition (PVD) machine. The working principle of PVD is to use Ar ions in a plasma to bombard a target material for sputtering the atoms of the target material and transferring the atoms to a surface of the glass substrate, to complete the deposition of a film layer. According to the requirements in depositing the film layer, a corresponding target material is mounted to a machine. With the passing of time, the target material is consumed unremittingly. Currently, the completion of the consumption of the target material on the machine cannot be found out in time, which may easily cause the situation of the breakdown of the target material, and thus influence the backboard and the product. In order to prevent the occurrence of this situation, it is required to master the consumption condition of the target material in time.

It is necessary to provide a novel apparatus and a novel method for film formation by physical sputtering so as to solve the above-mentioned problem.

SUMMARY OF THE INVENTION

In the present disclosure, an apparatus for film formation by physical sputtering has a simple structure, can monitor the consumption of the target material in real time, effectively avoid damage of a backboard and abnormality of a product resulting from breakdown of a target material, and improve the quality of the product. Meantime, the use efficiency of the target material can be improved and thus waste of the material, which would be otherwise caused by incomplete use of the target material, can be avoided.

In order to achieve the above objectives, the present disclosure provides an apparatus for film formation by physical sputtering, wherein the apparatus for film formation by physical sputtering comprises:

a vacuum chamber;

a substrate platform arranged inside of the chamber, and provided thereon, with a substrate to be formed with a film;

a target material arranged inside of the chamber, and opposite to the substrate;

at least one square resistance meter, which is connected to the target material to real-timely measure an actual resistance value of the target material;

an excitation source, which is used to bombard the target material for sputtering atoms of the target material; and a control system, which is connected to the square resistance meter.

In the above-mentioned apparatus for film formation by physical sputtering, the target material is arranged on a target material backboard.

In the above-mentioned apparatus for film formation by physical sputtering, the target material is conglutinated to the target material backboard via a bonding layer.

In the above-mentioned apparatus for film formation by physical sputtering, two ends of the target material are connected to the square resistance meters, respectively.

In the above-mentioned apparatus for film formation by physical sputtering, the square resistance meter comprises an insulated needle bar and a resistance measurement probe mounted inside of the insulated needle bar, wherein the insulated needle bar penetrates the target material backboard and the bonding layer so that the resistance measurement probe is connected to the target material.

In the above-mentioned apparatus for film formation by physical sputtering, a critical resistance value of the target material is set in the control system; and the control system obtains the actual resistance value measured by the square resistance meter and compares the actual resistance value with the critical resistance value, and issues an alarm signal when the actual resistance value reaches the critical resistance value.

In the present disclosure, the apparatus for film formation by physical sputtering has a simple structure. It can monitor the resistance of the target material in real time by connecting the square resistance meter to the target material. The consumption of the target material can be judged by the change of the resistance. When the target material is about to be consumed, the control system reminds one to replace the target material so as to avoid damage of the backboard and abnormality of a product resulting from breakdown of the target material, and improve the quality of the product. Meantime, the use efficiency of the target material can be improved and thus the waste of the material, which would otherwise be caused by incomplete use of the target material, can be avoided.

The present disclosure further provides a method for film formation by physical sputtering. The method is simple to operate, and can effectively avoid the occurrence of the breakdown of the target material during film formation of the substrate and ensure the product quality of the substrate. Meantime, the use efficiency of the target material can be improved and thus the waste of the material, which would otherwise be caused by incomplete use of the target material, can be avoided.

In order to achieve the above objectives, the present disclosure provides a method for film formation by physical sputtering, wherein the above-mentioned apparatus for film formation by physical sputtering is used, the method for film formation by physical sputtering comprising the following steps:

S1): measuring the actual resistance value of the target material in real time during film formation by sputtering on the substrate to be formed with a film; and S2): comparing the actual resistance value with a critical resistance value of the target material, and issuing an alarm signal when the resistance value reaches the critical resistance value so as to replace the target material.

In the above-mentioned method for film formation by physical sputtering, in step S1), the actual resistance value of the target material is measured by the square resistance meter.

In the above-mentioned method for film formation by physical sputtering, in step S2), the actual resistance value is back-fed to the control system, which compares the actual resistance value with the critical resistance value set in the control system.

In the above-mentioned method for film formation by physical sputtering, the actual resistance values of two ends of the target material are measured, respectively; and when either of the actual resistance values reaches the critical resistance value, the control system issues an alarm signal so as to replace the target material.

In the present disclosure, the method for film formation by physical sputtering is simple to operate, and can effectively avoid the occurrence of the breakdown of the target material during the film formation of the substrate and ensure the product quality of the substrate. Meantime, the use efficiency of the target material can be improved and thus the waste of the material, which would otherwise be caused by incomplete use of the target material, can be avoided.

The above technical features can be combined in various suitable means or substituted by equivalent technical features only if the objectives of the present disclosure can be achieved.

BRIEF DESCRIPTION OF THE DRAWINGS

The described drawings herein are merely for the purpose of explaining rather than limiting the scope of the present disclosure in any means. Moreover, the shapes and the proportional sizes of respective components in the drawings are merely illustrative, which are used to aid in understanding of the present disclosure rather than to specifically define the shapes and the proportional sizes of the respective components of the present disclosure. Under the guidance of the present disclosure, a person skilled in the art can carry out the present disclosure by selecting various possible shapes and proportional sizes based on specific conditions.

DETAILED DESCRIPTION OF THE EMBODIMENTS

In combination with the drawings and the description of the specific embodiments of the present disclosure, the details of the present disclosure can be clearly understood. However, the specific embodiments of the present disclosure described herein are merely for illustrating the purpose of the present disclosure rather than being regarded as the limitations to the present disclosure in any means. Under the guidance of the present disclosure, a skilled person can conceive any possible variation based on the present disclosure. This should be regarded as within the scope of the present disclosure. In the following part, the present disclosure will be further illustrated in combination with the drawings.

FIG. 1 to FIG. 6 respectively show a structural diagram of an apparatus for film formation by physical sputtering, a structural diagram of a target material, a structural diagram of a target material backboard, a structural diagram of a bonding layer, a structural diagram of a combined state of the target material and the target material backboard, and a structural diagram of connection between the target material and a control system of the present disclosure.

Figure 1:
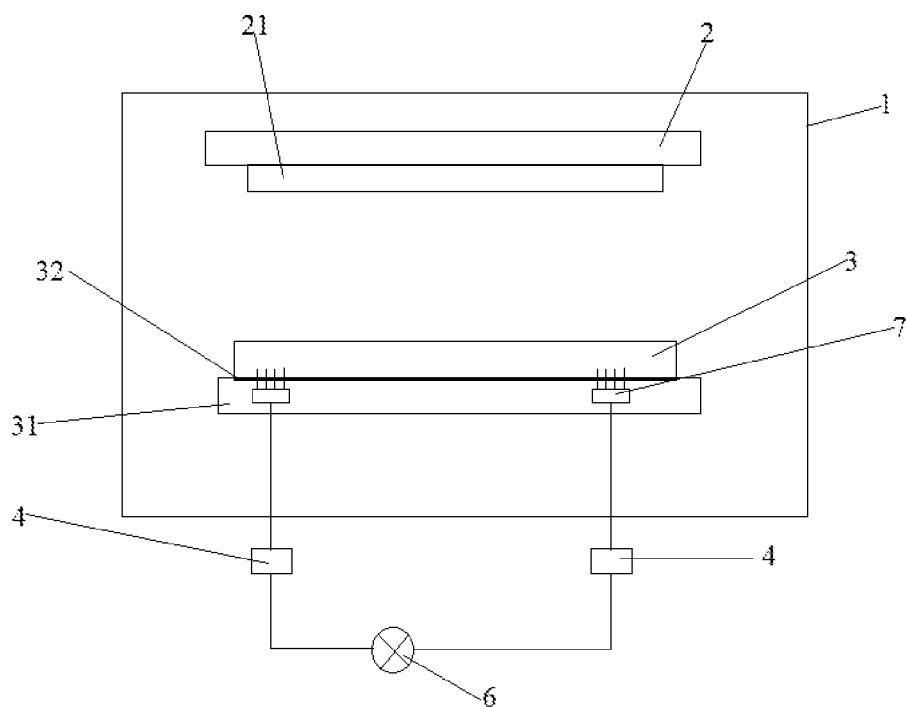
FIG. 1 is a structural diagram of an apparatus for film formation by physical sputtering of the present disclosure.
Figure 2:
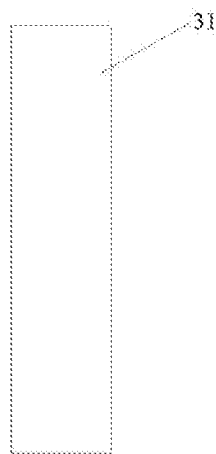
FIG. 2 is a structural diagram of a target material of the present disclosure.
Figure 3:
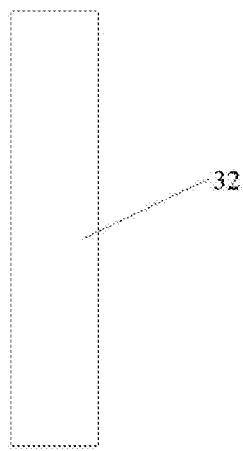
FIG. 3 is a structural diagram of a target material backboard of the present disclosure.
Figure 4:
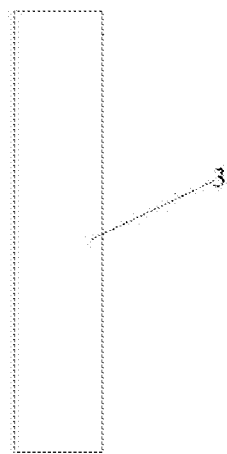
FIG. 4 is a structural diagram of a bonding layer of the present disclosure.
Figure 5:
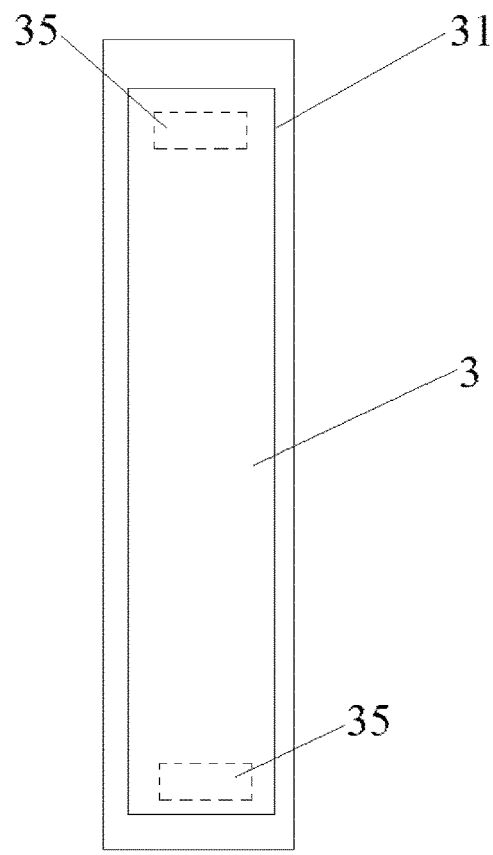
FIG. 5 is a structural diagram of a combined state of the target material and the target material backboard of the present disclosure.
Figure 6:
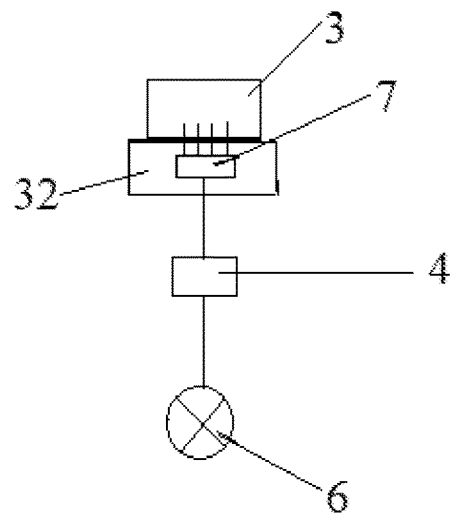
FIG. 6 is a structural diagram of connection between the target material and a control system of the present disclosure.

As shown in FIG. 1, the apparatus for film formation by physical sputtering of the present disclosure comprises a vacuum chamber 1, a substrate platform 2, a target material 3, a square resistance meter 4, an excitation source (not shown in the figure), and a control system 6 (which can be also called a central control system), wherein the substrate platform 2 is arranged inside of the chamber 1, and provided thereon with a substrate 21 to be formed with a film; the target material 3 is arranged inside of the chamber 1, and opposite to the substrate 21 (or to form an angle with the substrate 21); the square resistance meter 4 is connected to the target material 3 to real-timely measure an actual resistance value of the target material 3; the excitation source is used to bombard the target material 3 for sputtering atoms of the target material, so that the atoms of the target material are sputtered on the substrate 21 and a film layer is formed on the substrate 21; and the control system 6 is connected to the square resistance meter 4.

Specifically, in a specific embodiment, a critical resistance value of the target material 3 is set in the control system 6. The square resistance meter 4 measures the actual resistance value in a specific area of the target material 3, and feeds back the measured actual resistance value to the control system 6. The control system 6 compares the actual resistance value with the critical resistance value, and issues an alarm signal so as to replace the target material when the actual resistance value reaches the critical resistance value. At this moment, the control system 6 can send the signal to the excitation source to stop the excitation source from exciting the target material 3, and prepare to replace a corresponding new target material 3; or alternatively, the control system 6 can issue the alarm signal and when a working personnel hears the alarm signal, he stops the bombardment of the excitation source against the target material 3 and prepares to replace the corresponding new target material 3, so as to effectively avoid damage of the backboard and abnormality of the product resulting from breakdown of the target material, and improve the quality of the product. The use efficiency of the target material can be improved and thus the waste of the material, which would otherwise be caused by incomplete use of the target material, can be avoided. In a specific embodiment, two end areas 34 of the target material 3 are connected to the square resistance meters 4, respectively. Since target material at two ends of the target material 3 is consumed most rapidly, a phenomenon of breakdown firstly occurs at the two ends of the target material. If breakdown does not occur at the two ends of the target material, then it does not occur in any other area of the target material 3. It should be noted that the critical resistance value of the target material 3 is the resistance value when breakdown just occurs, wherein vacuumization of the chamber 1 is familiar to a person skilled in the art, and will not be repeated in detail herein.

In a specific embodiment, the target material 3 is arranged on a target material backboard 31. Specifically, the target material 3 is conglutinated to the target material backboard 31 via a bonding layer 32 so as to ensure that the target material 3 is stably arranged in the chamber 1. In a specific embodiment, the excitation source is a high-frequency high-voltage power supply. When the chamber 1 is in a vacuum state, a high voltage is applied between the target material 3 and the substrate 21. Electrons and ions move in a rapid pace under the high pressure. The ions hit the target material. For example, Ar ions hit the target material. The fast-moving electrons and ions hit gas molecules to produce more ions. After the ions hit the target material, atoms of the target material (or may be called particles of the target material) are sputtered. Sputtered particles reach the substrate to form a film thereon. During film formation, the target material 3 becomes thinner constantly, and thus resistance value of the target material 3 measured by the square resistance meter 4 also changes correspondingly, and approaches the critical resistance value constantly. When the measured resistance value is about to reach the critical resistance value, it is considered that the target material 3 will be completely consumed. That is to say, it can be considered that the target material reaches a consumption terminal. Of course, other excitation sources can also be used in the present disclosure and these excitation sources are not specifically limited.

In a specific embodiment, the square resistance meter 4 comprises an insulated needle bar (not shown in the figure) and a resistance measurement probe 7 mounted inside of the insulated needle bar, wherein the insulated needle bar penetrates the target material backboard 31 and the bonding layer 32 so that the resistance measurement probe 7 is connected to the target material 3. This design can help to achieve connection of the resistance measurement probe 7 to a lower surface of one end of the target material 3 through the bonding layer 32, without connecting a surface of the resistance measurement probe 7 to the bonding layer 32. This avoids resistance of the bonding layer 32 from disturbing the actual resistance value measured for the target material 3.

The apparatus for film formation by physical sputtering of the present disclosure has a simple structure. Back sides of the two ends, which are consumed most quickly, on the target material 3 are connected to the square resistance meters 4. The square resistance meters 4 can measure the actual resistance values of target material surfaces at such regions in real time, and variation of the actual resistance values is fed back to the control system 6. The control system 6 compares the fed-back actual resistance values with the critical resistance value (which can also be called a resistance endpoint value) set in the control system 6. When the actual resistance value of either of the two ends reaches the critical resistance value, it can be considered that the consumption of the target material reaches the terminal. At this moment, the control system 6 sends the alarm signal, stops discharge (i.e., to stop the bombardment of the excitation source against the target material 3), and prompts replacement of the target material, so as to effectively avoid an occurrence of breakdown of the target material. It should be noted that a front side of the target material 3 refers to a side thereof excited by the excitation source to sputter the atoms, and a back side thereof refers to a side which is opposite to the front side.

The present disclosure further discloses a method for film formation by physical sputtering. In film formation on the substrate, the above-mentioned apparatus for film formation by physical sputtering is used, wherein the method for film formation by physical sputtering comprises the following steps: step S1): the actual resistance value of the target material is measured in real time in film formation by sputtering on the substrate to be formed with a film; and step S2): the actual resistance value is compared with the critical resistance value of the target material; and the alarm signal is issued when the resistance value reaches the critical resistance value so as to replace the target material.

Specifically, the critical resistance value of the target material is firstly measured by the square resistance meter. That is to say, the resistance value of the target material which just causes breakdown of the target material is measured. This electronic value is the critical resistance value of the corresponding target material. Moreover, the critical resistance value is set in the control system and then the specific film formation is carried out.

In the procedure of film formation, both the target material and the substrate to be formed with a film are arranged in corresponding positions of the apparatus for film formation by physical sputtering. Afterwards, the chamber is vacuumized so that the chamber is in the vacuum state. When the chamber is in the vacuum state, a high voltage is applied between the target material and the substrate. The electrons and the ions move in a rapid pace under the high pressure. The ions hit the target material. For example, Ar ions hit the target material. The fast-moving electrons and ions hit the gas molecules to produce more ions. After the ions hit the target material, the atoms of the target material are sputtered. The sputtered particles reach the substrate to form a film.

During film formation, the square resistance meter measures the resistance of the target material in real time and the measured resistance value is fed back to the control system. The control system compares the actually measured resistance value with the critical resistance value. When the actually measured resistance value is about to reach or just reaches the critical resistance value, it is considered that the target material is completely consumed. During film formation, the target material becomes thinner constantly, and thus the resistance value of the target material measured by the square resistance meter also changes correspondingly. The actually measured resistance value approaches the critical resistance value constantly. When the measured resistance value is about to reach the critical resistance value, it is considered that the target material will be completely consumed.

In a specific embodiment, the actual resistance values of the two ends of the target material are measured, respectively. Since the two ends of the target material are consumed most quickly, these parts of the target material are punctured firstly. If this phenomenon does not occur in these parts, then none of other areas of the target material reaches a degree of breakdown. When the actual resistance value of either of the two ends reaches the critical resistance value, the control system sends the alarm signal to replace the target material. That is to say, when two actual resistance values are obtained by measuring the two ends of the target material, and either of the actual resistance values reaches the critical resistance value, it is considered that the target material is completely consumed. At this moment, the control system sends the alarm signal to replace the target material.

In a specific embodiment, the target material is arranged on the target material backboard. Specifically, the target material is conglutinated to the target material backboard via the bonding layer, so as to ensure that the target material can be stably arranged in the chamber. The square resistance meter comprises the insulated needle bar and the resistance measurement probe mounted inside of the insulated needle bar, wherein the insulated needle bar penetrates the target material backboard and the bonding layer so that the resistance measurement probe is connected to the target material. This design can be used to achieve connection of the resistance measurement probe to the lower surface of one end of the target material through the bonding layer, without connecting the surface of the resistance measurement probe to the bonding layer. This avoids the resistance of the bonding layer from disturbing the actual resistance value measured for the target material. The resistance measurement probe is connected to the square resistance meter, so as to accurately measure the actual resistance values of the two ends.

The method for film formation by physical sputtering of the present disclosure is simple to carry out. It can effectively avoid an occurrence of breakdown of the target material in film formation on the substrate, and ensure the quality of the product of the substrate. Meantime, the use efficiency of the target material can be improved and thus the waste of the material, which would otherwise be caused by incomplete use of the target material, can be avoided.

The present disclosure is described with reference to the preferred embodiments. Under the condition of not departing from the scope of the present disclosure, any skilled person can make any improvements and replace its components with equivalents. Particularly, as long as there is no structural conflict, all technical features mentioned in all the embodiments can be combined in any manners. The present disclosure is not limited to the specific embodiments disclosed herein but includes all the technical solutions falling within the scope of the claims.

The invention claimed is:

1. An apparatus for film formation by physical sputtering, comprising:
    a vacuum chamber;
    a substrate platform arranged inside of the chamber, and provided thereon with a substrate to be formed with a film;
    a target material arranged inside of the chamber, and opposite to the substrate;
    at least one square resistance meter, which is connected to the target material to real-time measure an actual resistance value of the target material;
    an excitation source, which is used to bombard the target material for sputtering atoms of the target material; and
    a control system, which is connected to the at least one square resistance meter;
    wherein the target material is conglutinated to a target material backboard via a bonding layer;
    wherein the at least one square resistance meter comprises an insulated needle bar and a resistance measurement probe mounted inside of the insulated needle bar, wherein the insulated needle bar penetrates the target material backboard and the bonding layer so that the resistance measurement probe is connected to a lower surface of one end of the target material through the bonding layer.

2. The apparatus for film formation by physical sputtering according to claim 1, wherein two ends of the target material are connected to square resistance meters, respectively.

3. The apparatus for film formation by physical sputtering according to claim 1, wherein a critical resistance value of the target material is set in the control system; and
    wherein the control system obtains the actual resistance value measured by the at least one square resistance meter, compares the actual resistance value with the critical resistance value, and issues an alarm signal when the actual resistance value reaches the critical resistance value.

4. A method for film formation by physical sputtering, wherein an apparatus for film formation by physical sputtering is used, the apparatus for film formation by physical sputtering comprising:
    a vacuum chamber;
    a substrate platform arranged inside of the chamber, and provided thereon with a substrate to be formed with a film;
    a target material arranged inside of the chamber, and opposite to the substrate;
    at least one square resistance meter, which is connected to the target material to real-time measure an actual resistance value of the target material;
    an excitation source, which is used to bombard the target material for sputtering atoms of the target material; and
    a control system, which is connected to the at least one square resistance meter,
    wherein the target material is conglutinated to a target material backboard via a bonding layer;
    wherein the at least one square resistance meter comprises an insulated needle bar and a resistance measurement probe mounted inside of the insulated needle bar, wherein the insulated needle bar penetrates the target material backboard and the bonding layer so that the resistance measurement probe is connected to a lower surface of one end of the target material through the bonding layer; and
    wherein the method for film formation by physical sputtering comprises the following steps:
    step S1): measuring the actual resistance value of the target material in real time during film formation by sputtering on the substrate to be formed with a film; and
    step S2): comparing the actual resistance value with a critical resistance value of the target material, and issuing an alarm signal when the resistance value reaches the critical resistance value so as to replace the target material.

5. The method for film formation by physical sputtering according to claim 4, wherein in step S1), the actual resistance value of the target material is measured by the at least one square resistance meter.

6. The method for film formation by physical sputtering according to claim 5, wherein in step S2), the actual resistance value is back-fed to the control system, which compares the actual resistance value with the critical resistance value set in the control system.

7. The method for film formation by physical sputtering according to claim 6, wherein the actual resistance values of two ends of the target material are measured, respectively; and
    wherein when either of the actual resistance values reaches the critical resistance value, the control system issues an alarm signal so as to replace the target material.

8. The method for film formation by physical sputtering according to claim 5, wherein the two ends of the target material are connected to square resistance meters, respectively.

* * * * *